(12) United States Patent
Bae et al.

(10) Patent No.: US 11,227,907 B2
(45) Date of Patent: Jan. 18, 2022

(54) DISPLAY PANEL AND DISPLAY APPARATUS INCLUDING SENSOR AREA

(71) Applicant: SAMSUNG DISPLAY CO., LTD., Yongin-Si (KR)

(72) Inventors: Injun Bae, Yongin-Si (KR); Chulho Kim, Yongin-Si (KR); Yunhwan Park, Yongin-Si (KR); Woori Seo, Yongin-si (KR); Dongbum Lee, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/745,901

(22) Filed: Jan. 17, 2020

(65) Prior Publication Data
US 2020/0235187 A1 Jul. 23, 2020

(30) Foreign Application Priority Data
Jan. 18, 2019 (KR) .................. 10-2019-0006950

(51) Int. Cl.
*H01L 27/32* (2006.01)
*H01L 51/00* (2006.01)

(52) U.S. Cl.
CPC ...... *H01L 27/3272* (2013.01); *H01L 27/3234* (2013.01); *H01L 27/3262* (2013.01); *H01L 27/3276* (2013.01); *H01L 51/0097* (2013.01); *H01L 2251/5338* (2013.01); *H01L 2251/558* (2013.01)

(58) Field of Classification Search
CPC ............ H01L 27/3272; H01L 27/3234; H01L 27/3262; H01L 27/3276; H01L 51/0097; H01L 2251/5338; H01L 2251/558
See application file for complete search history.

(56) References Cited

U.S. PATENT DOCUMENTS

| 2004/0183989 | A1* | 9/2004 | Kim ................... G02F 1/13394 349/155 |
| 2017/0117343 | A1 | 4/2017 | Oh et al. |
| 2017/0161543 | A1* | 6/2017 | Smith ............... G06K 9/00013 |
| 2018/0107241 | A1 | 4/2018 | Evans, V et al. |
| 2018/0212060 | A1 | 7/2018 | Kang et al. |

(Continued)

FOREIGN PATENT DOCUMENTS

| KR | 10-2017-0049705 | 5/2017 |
| KR | 10-2017-0078075 | 7/2017 |

(Continued)

*Primary Examiner* — Lex H Malsawma
(74) *Attorney, Agent, or Firm* — F. Chau & Associates, LLC

(57) ABSTRACT

A display apparatus has an enlarged display area so that an image can be displayed in a sensor area. The display apparatus includes: a first base layer that includes a display area that includes a plurality of main pixels and a sensor area that includes a plurality of auxiliary pixels and a transmission portion; a conductive layer positioned on the first base layer and that corresponds to the plurality of auxiliary pixels; and a second base layer positioned on the first base layer with the conductive layer positioned between the second base layer and the first base layer. A resolution of an image displayed by the sensor area is lower than a resolution of an image displayed by the display area.

18 Claims, 14 Drawing Sheets

(56) References Cited

U.S. PATENT DOCUMENTS

| | | | | |
|---|---|---|---|---|
| 2019/0122018 A1* | 4/2019 | Kho | ................ | G06K 9/0002 |
| 2019/0303639 A1* | 10/2019 | He | ................ | G06K 9/0004 |
| 2020/0227494 A1* | 7/2020 | Bae | ................ | H01L 27/3248 |
| 2020/0258947 A1* | 8/2020 | Chung | ................ | H01L 27/326 |
| 2020/0258967 A1* | 8/2020 | Kim | ................ | H01L 27/3281 |
| 2020/0295300 A1* | 9/2020 | Chung | ................ | G06F 1/1626 |

FOREIGN PATENT DOCUMENTS

| | | |
|---|---|---|
| KR | 10-2018-0025466 | 3/2018 |
| KR | 10-2018-0047607 | 5/2018 |
| KR | 10-2018-0088099 | 8/2018 |

* cited by examiner

DISPLAY PANEL AND DISPLAY APPARATUS INCLUDING SENSOR AREA

CROSS-REFERENCE TO RELATED APPLICATION

This application claims priority under 35 U.S.C. § 119 from, and the benefit of Korean Patent Application No. 10-2019-0006950, filed on Jan. 18, 2019 in the Korean Intellectual Property Office, the contents of which are herein incorporated by reference in their entirety.

BACKGROUND

1. Technical Field

One or more embodiments are directed to a display apparatus, and more particularly, to a display apparatus that has an enlarged display area so that an image may be represented in a sensor area.

2. Discussion of the Related Art

Recently, the use of display apparatuses has become diverse. In particular, the thicknesses and weights of display apparatuses have decreased, and thus, the range of their use has increased.

As display apparatuses are utilized in various ways, there may be various methods of designing the shapes of the display apparatuses. In addition, functions of combining or connecting a display apparatus with or to another display apparatus have increased.

SUMMARY

One or more embodiments include a display apparatus that has a sensor area in which a sensor, etc., is placed inside a display area so that functions of combining or connecting a display apparatus with or to another display apparatus can be increased.

According to one or more embodiments, a display panel includes: a first base layer that includes a display area that includes a plurality of main pixels and a sensor area that includes a plurality of auxiliary pixels and a transmission portion; a conductive layer positioned on the first base layer and that corresponds to the plurality of auxiliary pixels; and a second base layer positioned on the first base layer with the conductive layer positioned between the second base layer and the first base layer, wherein a resolution of an image displayed by the sensor area is lower than a resolution of an image displayed by the display area.

The conductive layer may have a thickness of 1500 Å or more.

The display panel may further include a first inorganic barrier layer positioned between the first base layer and the second base layer and a second inorganic barrier layer positioned on the second base layer, wherein the conductive layer may be positioned between the first inorganic barrier layer and the second base layer.

The first base layer and the second base layer may include organic materials and may be flexible.

The sensor area may include an auxiliary pixel area in which one or more auxiliary pixels are positioned, and a transmission area in which the transmission portion is positioned, and the auxiliary pixel area and the transmission area may be arranged in a form of a grid.

The conductive layer may correspond to the auxiliary pixel area.

The display panel may further include a first wiring electrically connected to the auxiliary pixels and that extends in a first direction and a second wiring that extends in a second direction that intersects with the first direction, wherein the conductive layer may be electrically connected to the first wiring or the second wiring via a contact hole.

The contact hole may be formed in a non-display area outside the display area.

The auxiliary pixels may include a first thin-film transistor that includes a first semiconductor layer and a second thin-film transistor that includes a second semiconductor layer, and the conductive layer may overlap the first semiconductor layer and not overlap the second semiconductor layer.

The first base layer may include a glass material, and the second base layer may include an organic material.

The thickness of the first base layer may be greater than a thickness of the second base layer.

The auxiliary pixels may include a common electrode that faces a pixel electrode and an intermediate layer positioned between the pixel electrode and the common electrode, and the common electrode may have an opening that corresponds to the transmission portion.

According to one or more embodiments, a display apparatus includes: a first base layer that includes a display area that includes a plurality of main pixels and a sensor area that includes a plurality of auxiliary pixels and a transmission portion; a conductive layer positioned on the first base layer and that corresponds to the plurality of auxiliary pixels; a second base layer positioned on the first base layer with the conductive layer positioned between the second base layer and the first base layer; and a component positioned under the first base layer and that corresponds to the sensor area.

The component may include an electronic element that emits or receives light.

The conductive layer may have a thickness of 1500 Å or more.

The sensor area may include an auxiliary pixel area in which one or more auxiliary pixels are positioned, and a transmission area in which the transmission portion is positioned, and the auxiliary pixel area and the transmission area may be arranged in a form of a grid.

The first base layer and the second base layer may include organic materials, and the display apparatus may further include a first inorganic barrier layer positioned between the first base layer and the second base layer and a second inorganic barrier layer positioned on the second base layer, and the conductive layer may be positioned between the first inorganic barrier layer and the second base layer.

The first base layer may include a glass material, and the second base layer may include an organic material, and the display apparatus may further include a buffer layer positioned on the second base layer.

A resolution of an image displayed by the sensor area may be lower than a resolution of an image displayed by the display area.

According to one or more embodiments, a display panel includes: a first base layer that includes a display area that includes a plurality of main pixels and a sensor area that includes a plurality of auxiliary pixels and a transmission portion; a conductive layer positioned on the first base layer and that corresponds to the plurality of auxiliary pixels; and a second base layer positioned on the first base layer with the conductive layer positioned between the second base layer and the first base layer, wherein the sensor area includes an auxiliary pixel area in which one or more auxiliary pixels are positioned, and a transmission area in which the transmission portion is positioned, and the auxiliary pixel area and the transmission area are arranged in a form of a grid.

DETAILED DESCRIPTION

Figure 1:
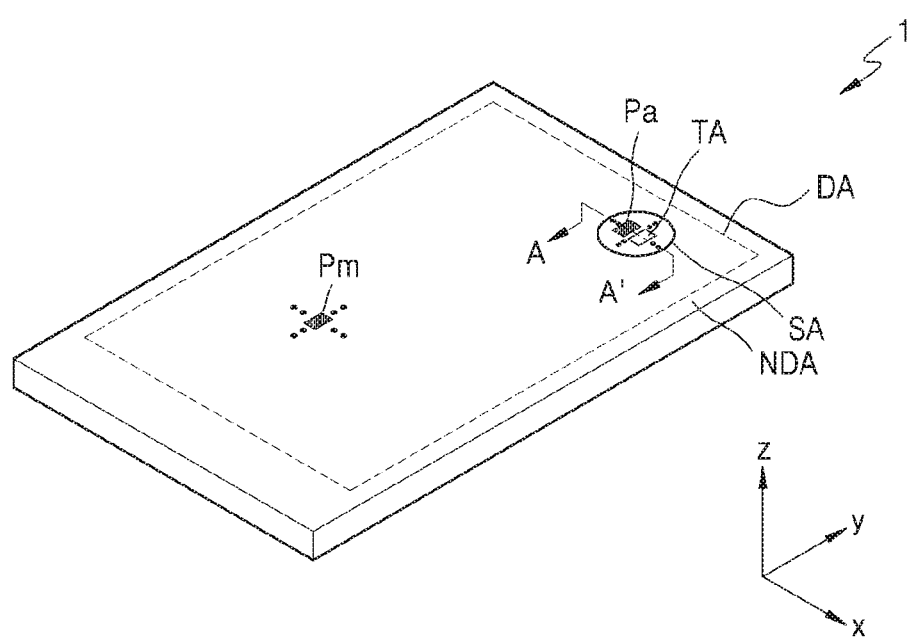
FIG. 1 is a perspective view of a display apparatus according to an embodiment.

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein.

Hereinafter, those components that are the same or are in correspondence may be identified by the same reference numeral regardless of the figure number, and a redundant description therewith is omitted.

It will be understood that when a layer, region, or component is referred to as being "formed on," another layer, region, or component, it may be directly or indirectly formed on the other layer, region, or component.

Sizes of elements in the drawings may be exaggerated for convenience of explanation.

FIG. 1 is a perspective view of a display apparatus according to an embodiment.

Referring to FIG. 1, according to an embodiment, a display apparatus 1 includes a display area DA in which an image is displayed and a non-display area NDA in which no image is displayed. The display apparatus 1 displays an image using light emitted from a plurality of main pixels Pm placed in the display area DA.

According to an embodiment, the display apparatus 1 includes a sensor area SA. The sensor area SA is an area under the display area DA in which a component, such as a sensor that uses infrared light (IR), visible light, or sound, is positioned, as will be described below with reference to FIG. 2. The sensor area SA includes a transmission portion TA through which light or sound is transmitted. The light or sound may be output from the component or may propagate towards the component from an external source. In an embodiment, when IR light is transmitted through the sensor area SA, light transmittance may be about 10% or higher, more particularly, about 20% or higher, about 25% or higher, about 50% or higher, about 85% or higher, or 90% or higher.

In a present embodiment, a plurality of auxiliary pixels Pa are positioned in the sensor area SA, and an image can be displayed from the sensor area SA using light emitted from the plurality of auxiliary pixels Pa. The image displayed from the sensor area SA has lower resolution than that of an image displayed from the display area DA. That is, because the sensor area SA includes the transmission portion TA through which light or sound can propagate, the number of auxiliary pixels Pa that can be positioned per unit area is less than the number of main pixels Pm positioned per unit area in the display area DA.

According to an embodiment, the sensor area SA is at least partially surrounded by the display area DA. In an embodiment, FIG. 1 illustrates the display area SA as being completely surrounded by the display area DA.

Hereinafter, according to an embodiment, an organic light-emitting display device (OLED) is used as the display apparatus 1. However, a display apparatus according to an embodiment is not limited thereto. In other embodiments, a other types of display apparatuses, such as an inorganic electroluminescence (EL) light-emitting display apparatus, a quantum dot light-emitting display apparatus, etc., may be used.

In FIG. 1, according to an embodiment, the sensor area SA is at one side, an upper right side, of a rectangularly shaped display area DA. However, embodiments are not limited thereto. The shape of the display area DA may be circular, elliptical, or polygonal, e.g., triangular or pentagonal, etc., and the position and the number of sensor areas SA can vary.

Figure 2:
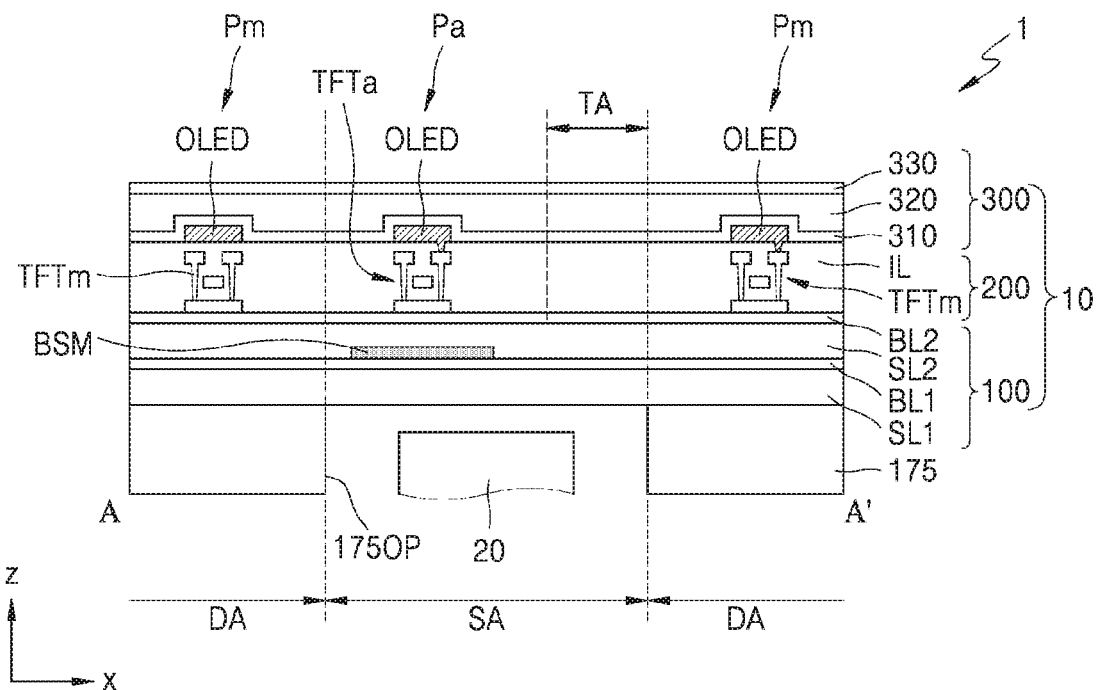
FIG. 2 is a cross-sectional view of a display apparatus according to an embodiment.

FIG. 2 is a cross-sectional view of a display apparatus according to an embodiment. FIG. 2 corresponds to a cross-section taken along a line A-A' of FIG. 1.

Referring to FIG. 2, according to an embodiment, the display apparatus 1 includes a display panel 10 that includes a display element, and a component 20 positioned under the display panel 10 and that corresponds to the sensor area SA.

According to an embodiment, display panel 10 includes a substrate 100, a display element layer 200 positioned on the substrate 100, and a thin-film encapsulation layer 300 positioned on the display element layer 200 and that seals the display element layer 200. In addition, the display panel 10 further includes a lower protective film 175 positioned below the substrate 100.

Figure 8:
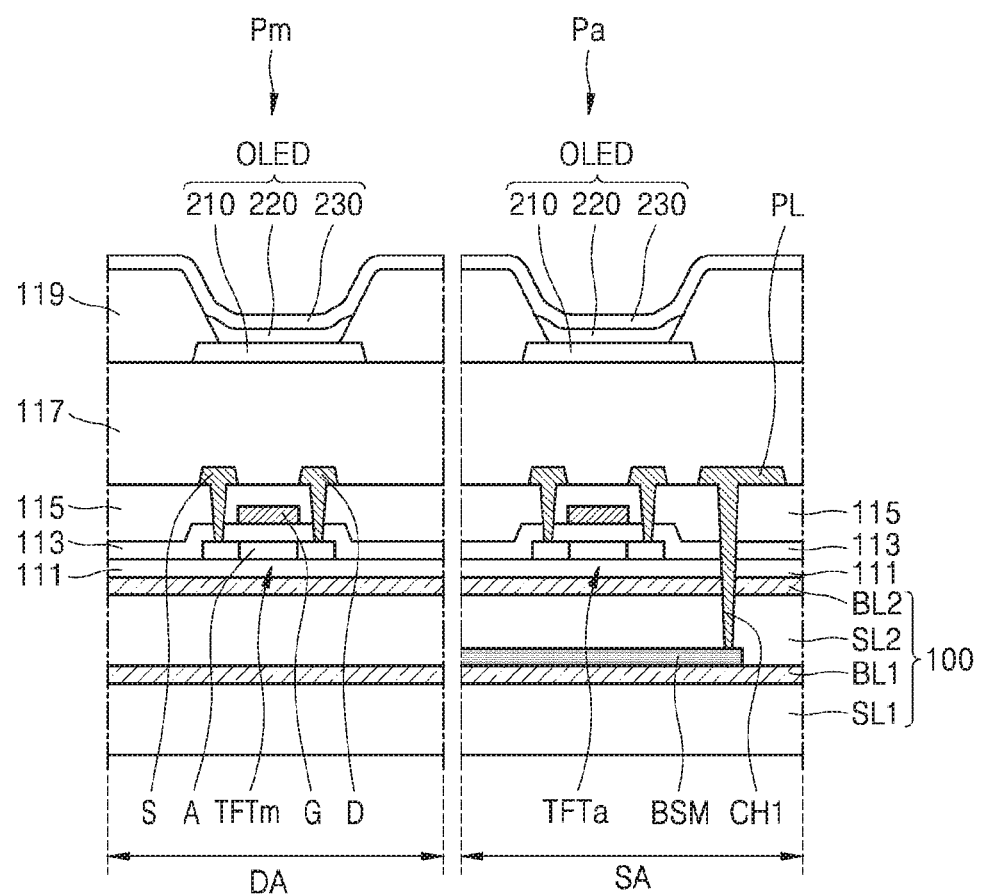
FIGS. 8 through 11 are cross-sectional views of a stack structure included in display panels according to embodiments.

According to an embodiment, the substrate 100 includes a first base layer SL1, a first barrier layer BL1, a second base layer SL2, and a second barrier layer BL2. The second base layer SL2 is stacked on the first base layer SL1, and the first barrier layer BL1 is interposed between the first base layer SL1 and the second base layer SL2. The second barrier layer BL2 is positioned on the second base layer SL2. In addition, a buffer layer may be positioned on the second barrier layer BL2, as shown in FIG. 8.

According to an embodiment, the first base layer SL1 and the second base layer SL2 include polymer resins. As the first base layer SL1 and the second base layer SL2 include polymer resins, the substrate 100 is flexible, rollable, or bendable. The polymer resins include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

In an embodiment, the first base layer SL1 and the second base layer SL2 may include the same polymer resin. In another embodiment, the first base layer SL1 and the second base layer SL2 include different polymer resins.

According to an embodiment, the first barrier layer BL1 and the second barrier layer BL2 include inorganic insulating materials. For example, the inorganic insulating materials include silicon oxide (SiO₂), silicon nitride (SiNx), or silicon oxynitride (SiON). The first barrier layer BL1 and the second barrier layer BL2 respectively positioned on upper surfaces of the first base layer SL1 and the second base layer SL2.

According to an embodiment, the display element layer 200 includes a circuit layer that includes a plurality of thin-film transistors (TFTs), such as a main TFT TFTm and an auxiliary TFT TFTa, and an OLED as a display element, and an insulating layer IL therebetween.

According to an embodiment, the main pixels Pm that include the main TFT TFTm and an OLED connected thereto are positioned in the display area DA, and the auxiliary pixels Pa that include the auxiliary TFT TFTa and an OLED connected thereto and associated wirings are positioned in the sensor area SA.

In addition, according to an embodiment, the auxiliary TFT TFTa and the transmission portion TA in which no display element is placed, are positioned in the sensor area SA. The transmission portion TA is an area through which light or a signal emitted from the component 20 or light or a signal incident on the component 20 can propagate.

According to an embodiment, the component 20 is placed in the sensor area SA. The component 20 is an electronic element that uses light or sound. For example, the component 20 may be a sensor that receives and uses light, such as an IR sensor, a sensor that outputs and detects light or sound to measure a distance or recognize a fingerprint, a small lamp that outputs light, or a speaker that outputs sound. In the case of an electronic element that uses light, light of various wavelengths, such as visible light, IR light, or ultraviolet (UV) light, may be used. There are a plurality of components 20 positioned in the sensor area SA. For example, the components 20 may include a light-emitting device and a light-receiving device in one sensor area SA. Alternatively, a light-emitting device and a light-receiving device may be simultaneously combined in one component 20.

In a present embodiment, a conductive layer BSM is positioned in the sensor area SA. The conductive layer BSM corresponds to the auxiliary pixel Pa within the sensor area SA. In detail, the conductive layer BSM corresponds to a lower portion of the auxiliary TFT TFTa. The conductive layer BSM prevents light emitted from the component 20 from reaching the auxiliary pixel Pa and the auxiliary TFT TFTa.

According to an embodiment, a constant voltage or signal is transmitted to the conductive layer BSM to prevent damage to a pixel circuit due to electrostatic discharge. In addition, the conductive layer BSM is connected to the auxiliary pixel Pa, is in electrical contact with wirings that transmit power or signals so that a constant voltage or signal can be transmitted to the conductive layer BSM.

According to an embodiment, the thin-film encapsulation layer 300 includes at least one inorganic encapsulation layer and at least one organic encapsulation layer. In this regard, FIG. 2 illustrates first and second inorganic encapsulation layers 310 and 330 and an organic encapsulation layer 320 therebetween.

According to an embodiment, the first and second inorganic encapsulation layers 310 and 330 include one or more inorganic insulating layers, such as aluminum oxide, titanium oxide, tantalum oxide, hafnium oxide, zinc oxide, silicon oxide, silicon nitride, or silicon oxynitride. The organic encapsulation layer 320 includes a polymer-based material. The polymer-based material includes polyethylene terephthalate (PET), polyethylene naphthalate (PEN), polycarbonate (PC), PI, polyethersulfonate, polyoxymethylene, polyarylate, hexamethyldisiloxane (HMDSO), an acryl-based resin, such as polymethyl methacrylate, polyacryl acid, etc., or an arbitrary combination thereof.

According to an embodiment, the lower protective film 175 is attached to a lower portion of the substrate 100 and supports and protects the substrate 100. The lower protective film 175 includes an opening 175OP that corresponds to the sensor area SA. The opening 175OP is formed in the lower protective film 175 to improve light transmittance of the sensor area SA. The lower protective film 175 may include PET or PI.

According to an embodiment, the area of the sensor area SA is greater than an area occupied by the component 20. In FIG. 2, the areas of the sensor area SA and the opening 175OP are the same. However, embodiments are not limited thereto, and in other embodiments, the area of the opening 175OP in the lower protective film 175 is not the same as the area of the sensor area SA. For example, the area of the opening 175OP may be less than the area of the sensor area SA.

in addition, according to an embodiment, other elements, such as an input sensing member that senses a touch input, an antireflective member that includes a polarizer, a retarder, or a color filter, a black matrix, or a transparent window, are further positioned on the display panel 10.

In a present embodiment, the thin-film encapsulation layer 300 is used as an encapsulation or a sealing member that seals the display element layer 200. However, embodiments are not limited thereto. For example, a sealing substrate combined with the substrate 100 can be used to seal the display element layer 200 using a sealant or a frit.

Figure 3:
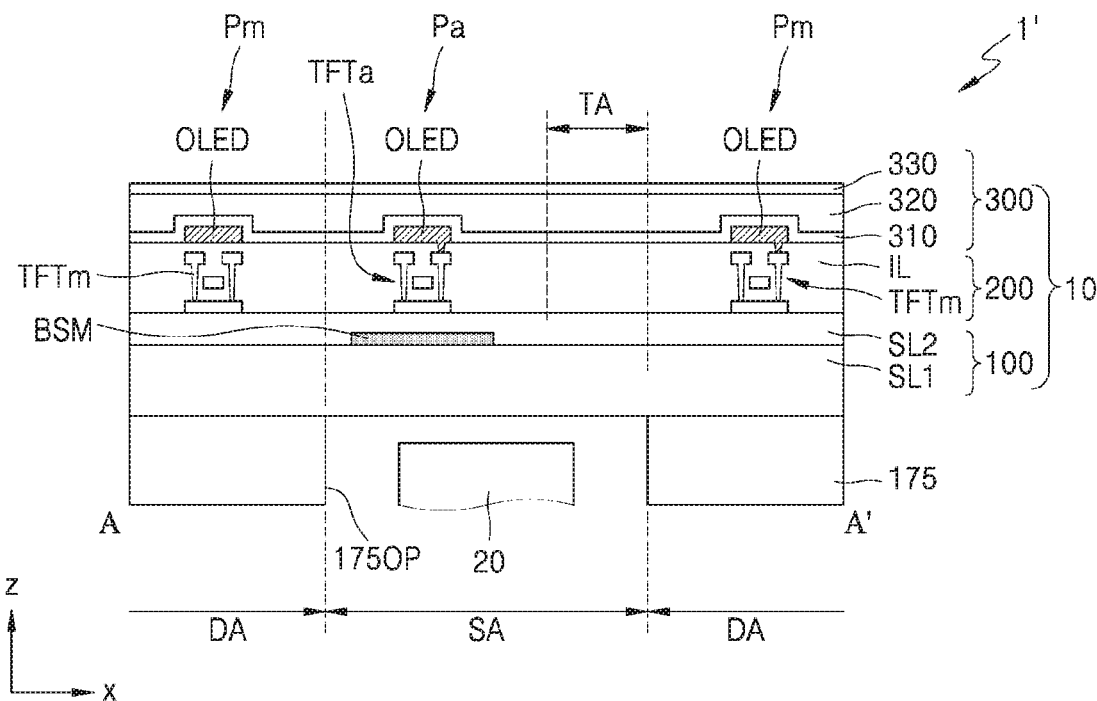
FIG. 3 is a cross-sectional view of a display apparatus according to another embodiment.

FIG. 3 is a cross-sectional view of a display apparatus according to another embodiment.

According to an embodiment, a display apparatus 1' of FIG. 3 differs from the display apparatus 1 of FIG. 2 in terms of the configuration of the substrate 100. The other configurations are the same as those of an embodiment of FIG. 2. Thus, a redundant description thereof is omitted, and the substrate 100 will be described.

According to an embodiment, the substrate 100 includes a first base layer SL1 and a second base layer SL2. The second base layer SL2 is positioned on the first base layer SL1.

In a present embodiment, the first base layer SL1 and the second base layer SL2 include different materials. The first base layer SL1 includes a glass material, and the second base layer SL2 includes an organic insulating material. The organic insulating material includes, for example, a general-purpose polymer, such as benzocyclobutene (BCB), PI, HMDSO, polymethylmethacrylate (PMMA), or PS, a polymer derivative that includes a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

According to an embodiment, the first base layer SL1 is a rigid substrate formed of the glass material. The conductive layer BSM is positioned on the first base layer SL1, and the second base layer SL2 is positioned on the conductive layer BSM and planarizes a top surface of the conductive layer BSM.

According to an embodiment, the conductive layer BSM corresponds to the auxiliary pixel Pa within the sensor area SA. In detail, the conductive layer BSM corresponds to a lower portion of the auxiliary TFT TFTa. In FIG. 3, the conductive layer BSM is directly positioned on the first base layer SL1. In another embodiment, an inorganic layer, such as a buffer layer, is positioned on the first base layer SL1, and the conductive layer BSM is positioned on the inorganic layer.

According to an embodiment, the conductive layer BSM prevents light emitted from the component 20 from reaching the auxiliary pixel Pa and the auxiliary TFT TFTa. A constant voltage or signal is transmitted to the conductive layer BSM to prevent damage to a pixel circuit due to electrostatic discharge.

According to an embodiment, the conductive layer BSM shown in FIGS. 2 and 3 has a thickness of about 1500 Å or more. In an embodiment, the conductive layer BSM has a thickness of 800 Å or more, 1000 Å or more, 1500 Å or more, or 2000 Å or more. These thicknesses depend on a function and role of the above-described conductive layer BSM. To prevent light emitted from the component 20 from reaching the auxiliary pixel Pa, the conductive layer BSM has a minimum thickness of 1500 Å. When the thickness of the conductive layer BSM is less than 1500 Å, the light emitted from the component 20 is not completely blocked.

In a comparative example, when an inorganic layer, such as a buffer layer or an inorganic barrier layer, is positioned on the conductive layer BSM, due to the thickness of the conductive layer BSM, cracks can occur in the inorganic layer at a stepped portion of the conductive layer BSM. These cracks can propagate into an upper wiring and a circuit device, and can cause a short-circuit of a semiconductor layer of a TFT, thereby causing visible defects in a pixel. Experimentally, cracks can occur when the conductive layer BSM has a thickness of 800 Å or more. Thus, it can be challenging to implement the conductive layer BSM with a thickness of 1500 Å or more.

Thus, in a display panel according to one or more embodiments, as the conductive layer BSM is positioned between the first base layer SL1 formed of an organic material or a glass material and the second base layer SL2 formed of an organic material, the conductive layer BSM can be provided with different thicknesses, such as 800 Å or more, or 1500 Å or more. The second base layer SL2 formed of an organic material planarizes the top surface of the conductive layer BSM so that a circuit device, such as a TFT, can be easily formed on the second base layer SL2.

Figure 4:
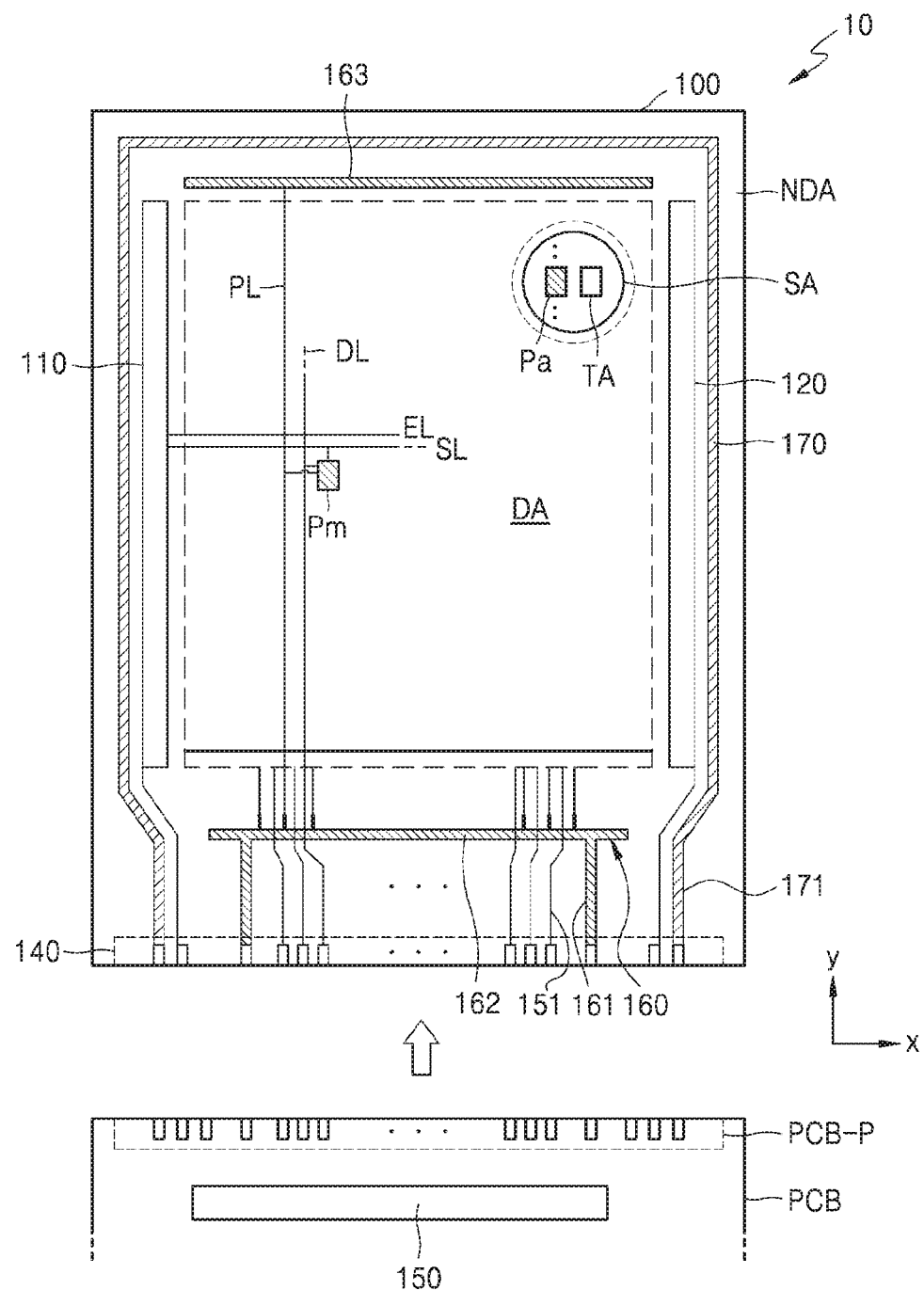
FIG. 4 is a plan view of a display panel according to an embodiment.
Figure 5:
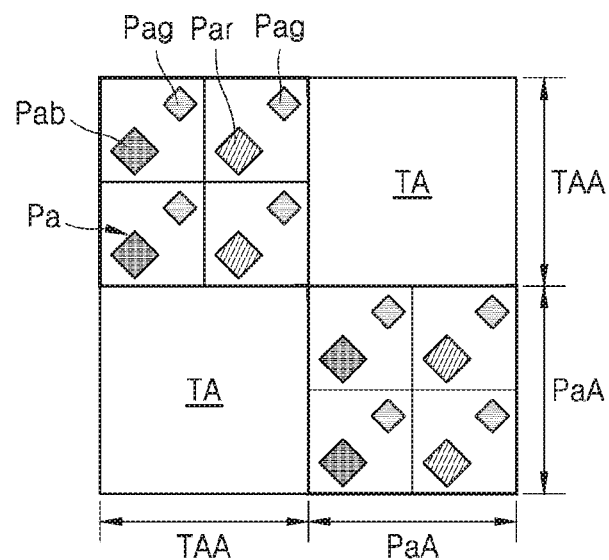
FIG. 5 is an enlarged plan view of a sensor area illustrated in FIG. 4.

FIG. 4 is a plan view of a display panel according to an embodiment, and FIG. 5 is an enlarged plan view of the sensor area SA illustrated in FIG. 4.

Referring to FIG. 4, according to an embodiment, the display panel 10 is includes the display area DA that includes a plurality of main pixels Pm. Each of the plurality of main pixels Pm includes a display element, such as an OLED. Each of the main pixels Pm emits one of red light, green light, blue light, or white light through the OLED. The display area DA is covered by the encapsulation member described with reference to FIG. 2 and is protected from external air or moisture.

According to an embodiment, the sensor area SA is positioned inside the display area DA, and a plurality of auxiliary pixels Pa are positioned in the sensor area SA. Each of the auxiliary pixels Pa includes a display element, such as an OLED. Each auxiliary pixel Pa emits one of red light, green light, blue light, or white light through the OLED. A transmission portion TA is provided in the sensor area SA and positioned between the auxiliary pixels Pa.

In an embodiment, a main pixel Pm and an auxiliary pixel Pa include the same pixel circuits. However, embodiments are not limited thereto. In other embodiment, a pixel circuit included in the main pixels Pm differs from a pixel circuit included in the auxiliary pixels Pa.

According to an embodiment, because the sensor area SA includes the transmission area TA, the resolution of the sensor area SA is lower than that of the display area DA. For example, the resolution of the sensor area SA is about ½ of that of the display area DA. In some embodiments, the resolution of the display area DA is 400 ppi or higher, and the resolution of the sensor area SA is about 200 ppi.

Referring to FIG. 5, according to an embodiment, the sensor area SA includes an auxiliary pixel area PaA that includes one or more auxiliary pixels Pa and a transmission area TAA that includes the transmission portion TA. The auxiliary pixel area PaA and the transmission area TAA are arranged in the form of grids.

In an embodiment, the auxiliary pixel area PaA includes a first auxiliary pixel Par that emits red light, a second auxiliary pixel Pag that emits green light, and a third auxiliary pixel Pab that emits blue light. In FIG. 5, the auxiliary pixels Pa have a pentile type arrangement. However, embodiments are not limited thereto, and the auxiliary pixels Pa may have other arrangements, such as stripes. Also, in FIG. 5, eight auxiliary pixels Pa are provided in the auxiliary pixel area PaA. However, the number of auxiliary pixels Pa can vary according to the resolution of the sensor area SA.

According to an embodiment, each of the main and auxiliary pixels Pm and Pa are electrically connected to outer circuits positioned in the non-display area NDA. A first scan driving circuit 110, a second scan driving circuit 120, a terminal 140, a data driving circuit 150, a first power supply line 160, and a second power supply line 170 are positioned in the non-display area NDA.

According to an embodiment, the first scan driving circuit 110 transmits a scan signal to each of the main and auxiliary pixels Pm and Pa via the scan line SL. The first scan driving circuit 110 transmits an emission control signal to each pixel via an emission control line EL. The second scan driving circuit 120 is positioned parallel to the first scan driving circuit 110 with the display area DA in between the second scan driving circuit 120 and the first scan driving circuit 110. Some of the main and auxiliary pixels Pm and Pa in the display area DA are electrically connected to the first scan driving circuit 110, and the others of the main and auxiliary pixels Pm and Pa in the display area DA are connected to the second scan driving circuit 120. In another embodiment, the second scan driving circuit 120 is omitted.

According to an embodiment, the terminal 140 is positioned at one side of the substrate 100. The terminal 140 is not covered by an insulating layer but is exposed and electrically connected to a printed circuit board (PCB). A pad PCB-P of the PCB is electrically connected to the terminal 140 of the display panel 10. The PCB transmits a signal or power of a controller to the display panel 10. The control signal generated by the controller is transmitted to each of the first and second scan driving circuits 110 and 120 via the PCB. The controller transmits first and second power supply voltages ELVDD and ELVSS of FIGS. 6 and 7, described below, to first and second power supply lines 160 and 170 via first and second connection wirings 161 and 171. The first power supply voltage ELVDD is transmitted to each of the main and auxiliary pixels Pm and Pa via a driving voltage line PL connected to the first power supply line 160, and the second power supply voltage ELVSS is transmitted to an opposite electrode of each of the main and auxiliary pixels Pm and Pa connected to the second power supply line 170.

According to an embodiment, the data driving circuit 150 is electrically connected to a data line DL. The data signal of the data driving circuit 150 is transmitted to each of the main and auxiliary pixels Pm and Pa via a connection wiring 151 connected to the terminal 140 and the data line DL. FIG. 4 illustrates the data driving circuit 150 as being positioned on the PCB. In another embodiment, the data driving circuit 150 is positioned on the substrate 100. For example, the data driving circuit 150 can be positioned between the terminal 140 and the first power supply line 160.

According to an embodiment, the first power supply line 160 includes a first sub-line 162 and a second sub-line 163, which extend parallel to each other in an x-direction, with the display area DA between the first sub-line 162 and the second sub-line 163. The second power supply line 170 has a loop shape with one open side and partially surrounds the display area DA.

Figure 6:
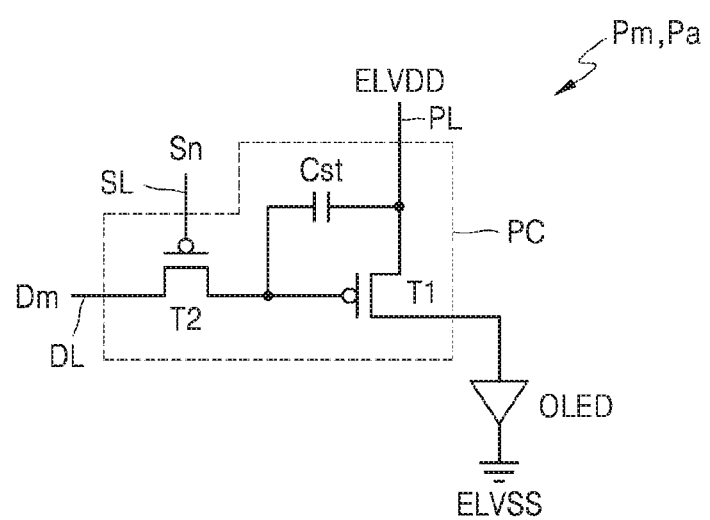
FIG. 6 is an equivalent circuit diagram of a pixel according to an embodiment.
Figure 7:
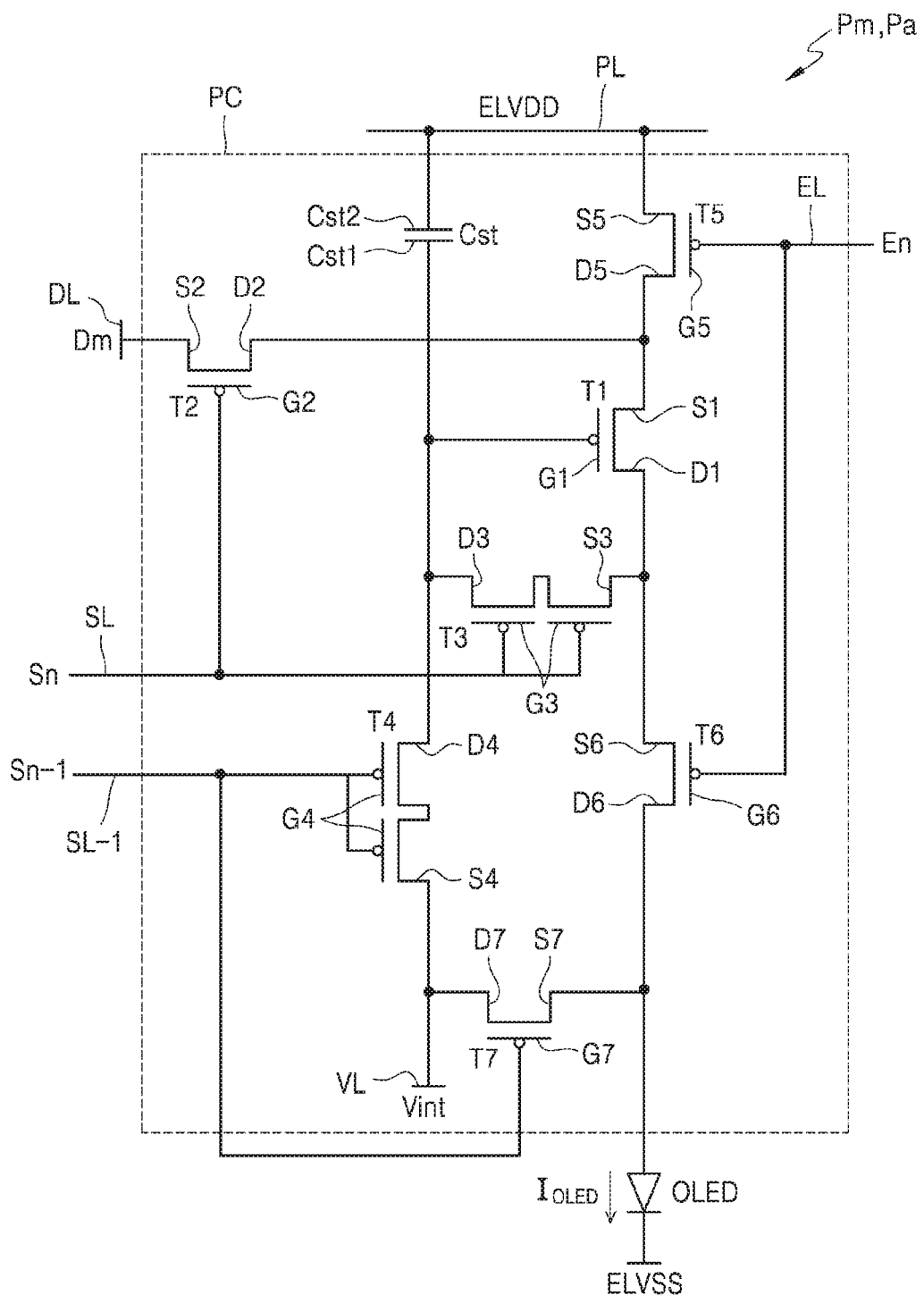
FIG. 7 is an equivalent circuit diagram of a pixel according to another embodiment.

FIG. 6 is an equivalent circuit diagram of a pixel according to an embodiment, and FIG. 7 is an equivalent circuit diagram of a pixel according to another embodiment.

According to an embodiment, the equivalent circuit diagram of FIG. 6 or 7 applies to the main pixels Pm or the auxiliary pixels Pa.

Referring to FIG. 6, according to an embodiment, each of the main and auxiliary pixels Pm and Pa includes a pixel circuit PC connected to the scan line SL and the data line DL, and an OLED connected to the pixel circuit PC.

According to an embodiment, the pixel circuit PC includes a driving TFT T1, a switching TFT T2, and a storage capacitor Cst. The switching TFT T2 is connected to the scan line SL and the data line DL and transmits a data signal Dm input through the data line DL to the driving TFT T1 according to the scan signal Sn received through the scan line SL.

According to an embodiment, the storage capacitor Cst is connected to the switching TFT T2 and the driving voltage line PL and stores a voltage that corresponds to a difference between a voltage transmitted from the switching TFT T2 and the first power supply voltage ELVDD, which is a driving voltage, transmitted to the driving voltage line PL.

According to an embodiment, the driving TFT T1 is connected to the driving voltage line PL and the storage capacitor Cst and controls a driving current that flows through the OLED from the driving voltage line PL in correspondence with a voltage stored in the storage capacitor Cst. The OLED emits light having a brightness that corresponds to the driving current.

In FIG. 6, according to an embodiment, the pixel circuit PC includes two TFTs and one storage capacitor. However, embodiments are not limited thereto. As shown in FIG. 7, the pixel circuit PC can include seven TFTs and one storage capacitor.

Referring to FIG. 7, according to an embodiment, each of the main and auxiliary pixels Pm and Pa includes the pixel circuit PC and an OLED connected to the pixel circuit PC. The pixel circuit PC includes a plurality of TFTs and a storage capacitor. The plurality of TFTs and the storage capacitor are connected to signal lines SL, SL-1, EL, and DL, an initialization voltage line VL, and the driving voltage line PL.

In FIG. 7, according to an embodiment, each of the main and auxiliary pixels Pm and Pa is connected to the signal lines SL, SL-1, EL, and DL, the initialization voltage line VL, and the driving voltage line PL. However, embodiments are not limited thereto. In another embodiment, at least one of the signal lines SL, SL-1, EL, and DL, the initialization voltage line VL, and the driving voltage line PL is shared with adjacent pixels.

According to an embodiment, the plurality of TFTs include a driving TFT T1, a switching TFT T2, a compensation TFT T3, a first initialization TFT T4, an operation control TFT T5, an emission control TFT T6, and a second initialization TFT T7.

According to an embodiment, the signal lines include the scan line SL that transmits the scan signal Sn, a previous scan line SL-1 that transmits the previous scan signal Sn-1 to the first initialization TFT T4 and the second initialization TFT T7, the emission control line EL that transmits the emission control signal En to the operation control TFT T5 and the emission control TFT T6, and the data line DL that intersects with the scan line SL and transmits the data signal Dm. The driving voltage line PL transmits the driving voltage ELVDD to the driving TFT T1, and the initialization voltage line VL transmits an initialization voltage Vint that initializes the driving TFT T1 and a pixel electrode of the OLED.

According to an embodiment, a driving gate electrode G1 of the driving TFT T1 is connected to a first storage capacitor plate Cst1 of the storage capacitor Cst, a driving source electrode S1 of the driving TFT T1 is connected to the driving voltage line PL via the operation control TFT T5, and a driving drain electrode D1 of the driving TFT T1 is electrically connected to the pixel electrode of the OLED via the emission control TFT T6. The driving TFT T1 receives the data signal Dm according to a switching operation of the switching TFT T2 and transmits a driving current $I_{OLED}$ to a main OLED.

According to an embodiment, a switching gate electrode G2 of the switching TFT T2 is connected to the scan line SL, a switching source electrode S2 of the switching TFT T2 is connected to the data line DL, and a switching drain electrode D2 of the switching TFT T2 is connected to the driving source electrode S1 of the driving TFT T1 and connected to the driving voltage line PL via the operation control TFT T5. The switching TFT T2 is turned on according to the scan signal Sn received via the scan line SL and performs a switching operation of transmitting the data signal Dm received via the data line DL to the driving source electrode S1 of the driving TFT T1.

According to an embodiment, a compensation gate electrode G3 of the compensation TFT T3 is connected to the scan line SL, a compensation source electrode S3 of the compensation TFT T3 is connected to the driving drain electrode D1 of the driving TFT T1 and connected to the pixel electrode of the OLED via the emission control TFT T6, and a compensation drain electrode D3 of the compensation TFT T3 is connected to the first storage capacitor plate Cst1 of the storage capacitor Cst, the first initialization drain electrode D4 of the first initialization TFT T4, and the driving gate electrode G1 of the driving TFT T1. The compensation TFT T3 is turned on according to the scan signal Sn received via the scan line SL and electrically connects the driving gate electrode G1 to the driving drain electrode D1 of the driving TFT T1, thereby diode-connecting the driving TFT T1.

According to an embodiment, a first initialization gate electrode G4 of the first initialization TFT T4 is connected to the previous scan line SL-1, a first initialization source electrode S4 of the first initialization TFT T4 is connected to a second initialization drain electrode D7 of the second initialization TFT T7 and the initialization voltage line VL, and a first initialization drain electrode D4 of the first initialization TFT T4 is connected to the first storage capacitor plate Cst1 of the storage capacitor Cst, the compensation drain electrode D3 of the compensation TFT T3, and the driving gate electrode G1 of the driving TFT T1. The first initialization TFT T4 is turned on according to the previous scan signal Sn-1 received via the previous scan line SL-1 and performs an initialization operation of transmitting the initialization voltage Vint to the driving gate electrode G1 of the driving TFT T1 to initialize a voltage of the driving gate electrode G1 of the driving TFT T1.

According to an embodiment, an operation control gate electrode G5 of the operation control TFT T5 is connected to the emission control line EL, an operation control source electrode S5 of the operation control TFT T5 is connected to the driving voltage line PL, and an operation control drain electrode D5 of the operation control TFT T5 is connected to the driving source electrode S1 of the driving TFT T1 and the switching drain electrode D2 of the switching TFT T2.

According to an embodiment, an emission control gate electrode G6 of the emission control TFT T6 is connected to the emission control line EL, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to the second initialization source S7 of the second initialization TFT T7 and the pixel electrode of the OLED.

According to an embodiment, the operation control TFT T5 and the emission control TFT T6 may be simultaneously turned on according to the emission control signal En received via the emission control line EL so that the driving voltage ELVDD is transmitted to the main OLED and the driving current $I_{OLED}$ flows through the main OLED.

According to an embodiment, a second initialization gate electrode G7 of the second initialization TFT T7 is connected to the previous scan line SL-1, a second initialization source electrode S7 of the second initialization TFT T7 is connected to the emission control drain electrode D6 of the emission control TFT T6 and the pixel electrode of the main OLED, and a second initialization drain electrode D7 of the second initialization TFT T7 is connected to the first initialization source electrode S4 of the first initialization TFT T4 and the initialization voltage line VL. The second initialization TFT T7 is turned on according to the previous scan signal Sn-1 received via the previous scan line SL-1 and initializes the pixel electrode of the main OLED.

In FIG. 7, according to an embodiment, the first initialization TFT T4 and the second initialization TFT T7 are connected to the previous scan line SL-1. However, embodiments are not limited thereto. In another embodiment, the first initialization TFT T4 is connected to the previous scan line SL-1 and is driven according to the previous scan signal Sn-1, and the second initialization TFT T7 is connected to an additional signal line, such as a subsequent scan line, and is driven according to a signal to be transmitted to the subsequent scan line.

According to an embodiment, a second storage capacitor plate Cst2 of the storage capacitor Cst is connected to the driving voltage line PL, and an opposite electrode of the OLED is connected to a second power supply voltage ELVSS, which is a common voltage. Thus, the OLED receives the driving current $I_{OLED}$ from the driving TFT T1 and emits light, thereby displaying an image.

In FIG. 7, according to an embodiment, the compensation TFT T3 and the first initialization TFT T4 have dual gate electrodes. However, embodiments are not limited thereto, and in other embodiments', the compensation TFT T3 and the first initialization TFT T4 have one gate electrode.

In a present embodiment, one main pixel Pm and one auxiliary pixel Pa have a pixel circuit PC with the same structure. However, embodiments are not limited thereto. In other embodiments, the main pixels Pm and the auxiliary pixels Pa include pixel circuits PC having different structures. For example, there are embodiments where the main pixels Pm use the pixel circuit of FIG. 7, and the auxiliary pixels Pa use the pixel circuit of FIG. 6.

FIGS. 8 through 11 are cross-sectional views of a stack structure included in display panels according to embodiments.

Referring to FIG. 8, according to an embodiment, the main pixels Pm are positioned in the display area DA, and the auxiliary pixels Pa and the transmission portion TA are positioned in the sensor area SA. Hereinafter, one pixel structure will be described based on the main pixels Pm. However, the auxiliary pixels Pa have substantially the same structures.

According to an embodiment, the substrate 100 includes a first base layer SL1 and a second base layer SL2. The first base layer SL1 and the second base layer SL2 include polymer resins. The polymer resins include PES, PAR, PEI, PEN, PET, PPS, polyarylate, PI, PC, or CAP. The substrate 100 that includes a polymer resin is flexible, rollable, or bendable.

According to an embodiment, the substrate 100 has a multi-layer structure that includes the above-described first and second base layers SL1 and SL2 and first and second barrier layers BL1 and BL2 therebetween. The first and second base layers SL1 and SL2 and the first and second barrier layers BL1 and BL2 are alternately stacked. The first and second barrier layers BL1 and BL2 include inorganic insulating materials to prevent moisture or impurities from seeping into the display panel 10 via the first and second base layers SL1 and SL2.

According to an embodiment, a buffer layer 111 is positioned on the substrate 100 and reduces or prevents penetration of foreign substances, moisture, or external air from a lower portion of the substrate 100 and provides a flat surface to the substrate 100. The buffer layer 111 may include an inorganic material such as an oxide or a nitride, an organic material, or an organic/inorganic compound and may have a single layer or multi-layer structure that includes the inorganic material and the organic material.

According to an embodiment, a semiconductor layer A is positioned on the buffer layer 111. The semiconductor layer A includes amorphous silicon. In another embodiment, the semiconductor layer A includes an oxide semiconductor that includes indium (In), gallium (Ga), tin (Sn), zirconium (Zr), vanadium (V), hafnium (Hf), cadmium (Cd), germanium (Ge), chromium (Cr), titanium (Ti), or zinc (Zn). For example, the semiconductor layer A includes an oxide semiconductor, such as indium gallium zinc oxide (IGZO), zinc tin oxide (ZTO), or zinc indium oxide (ZIO).

According to an embodiment, the gate electrode G is positioned on the semiconductor layer A with a gate insulating layer 113 between the gate electrode G and the semiconductor layer A. The gate electrode G includes molybdenum (Mo), aluminum (Al), copper (Cu), Ti, etc., and has a single layer or multi-layer structure. For example, the gate electrode G has a single layer structure of Mo.

According to an embodiment, the gate insulating layer 113 includes silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

According to an embodiment, the source electrode S and the drain electrode D are positioned on the gate electrode G with the interlayer insulating layer 115 between the source electrode S and the drain electrode D and the gate electrode G. The source electrode S and the drain electrode D include Mo, Al, Cu, Ti, etc., and have a single layer or multi-layer structure. In an example, the source electrode S and the drain electrode D have a multi-layer structure of Ti/Al/Ti.

According to an embodiment, a planarization layer 117 covers a top surface of the source electrode S and the drain electrode D and has a flat top surface so that a pixel electrode 210 can be flatly formed. The planarization layer 117 may have a single layer or multi-layer structure formed of an organic material. The planarization layer 117 may include a general-purpose polymer such as BCB, PI, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 includes an inorganic material, chemical planarization polishing may be performed according to circumstances. The planarization layer 117 may include both an organic material and an inorganic material.

According to an embodiment, a pixel electrode 210 may be a (semi-)light-transmitting electrode or a reflective electrode. In some embodiments, the pixel electrode 210 includes a reflective layer formed of Ag, Mg, Al, Pt, Pd, Au, Ni, Nd, Ir, Cr, or a compound thereof, and a transparent or semitransparent electrode layer formed on the reflective layer. The transparent or semitransparent electrode layer includes at least one of ITO, IZO, ZnO, $In_2O_3$, IGO, or aluminum zinc oxide (AZO). In some embodiments, the pixel electrode 210 has a stack structure of ITO/Ag/ITO.

According to an embodiment, a pixel-defining layer 119 is positioned on the planarization layer 117. The pixel-defining layer 119 has an opening through which a center of the pixel electrode 210 is exposed, thereby defining an emission area of a pixel. In addition, the pixel-defining layer 119 increases a distance between edges of the pixel electrode 210 and an opposite electrode 230 at an upper portion of the pixel electrode 210, thereby preventing an arc from occurring at the edges of the pixel electrode 210. The pixel-defining layer 119 is formed of an organic insulating material, such as PI, polyamide, acryl resin, BCB, HMDSO, or a phenol resin using spin coating.

According to an embodiment, an intermediate layer 220 of the OLED includes an organic emission layer. The organic emission layer includes an organic material that includes a fluorescent or phosphorescent material that emits red light, green light, blue light, or white light. The organic emission layer is a low molecular weight organic material or polymer organic material, and a functional layer, such as a hole transport layer (HTL), a hole injection layer (HIL), an electron transport layer (ETL), or an electron injection layer (EIL), are optionally further positioned under or on the organic emission layer. The intermediate layer 220 corresponds to each of the plurality of pixel electrodes 210. However, embodiments are not limited thereto. In other embodiments, the intermediate layer 220 includes a one-body layer that extends over all of the plurality of pixel electrodes 210.

According to an embodiment, the opposite electrode 230 may include a light-transmitting electrode or a reflective electrode. In some embodiments, the opposite electrode 230 includes a transparent or semi-transparent electrode and includes a thin metal layer having a small work function, such as Li, Ca, LiF/Ca, LiF/Al, Al, Ag, Mg, or a compound thereof. In addition, a transparent conductive oxide (TCO) layer, such as ITO, IZO, ZnO or $In_2O_3$, may be further positioned on the thin metal layer. The opposite electrode 230 is positioned in the display area DA and the peripheral area PA and on the intermediate layer 220 and the pixel-defining layer 119. The opposite electrode 230 is formed as one integral body on a plurality of OLEDs and corresponds to the plurality of pixel electrodes 210.

According to an embodiment, when the pixel electrode 210 is a reflective electrode and the opposite electrode 230 is a light-transmitting electrode, light emitted from the intermediate layer 220 is emitted toward the opposite electrode 230 so that the display apparatus is a top (front) emission type. When the pixel electrode 210 is a transparent or semi-transparent electrode and the opposite electrode 230 is a reflective electrode, light emitted from the intermediate layer 220 is emitted toward the substrate 100 so that the display apparatus is a bottom (rear) emission type. However, embodiments are not limited thereto. A display apparatus according to a present embodiment can be a dual emission type in which light is emitted in both directions, such as front and rear directions.

An above-described pixel structure according to an embodiment can be incorporated into both the main pixels Pm and the auxiliary pixels Pa.

According to an embodiment, a conductive layer BSM is positioned at a lower portion of each of the auxiliary pixels Pa. The conductive layer BSM overlaps a front surface of the lower portion of each auxiliary pixel Pa and the semiconductor layer Aa of the auxiliary TFT TFTa. The conductive layer BSM prevents light emitted from the component 20 from reaching the auxiliary pixels Pa and the auxiliary TFT TFTa.

Figure 9:
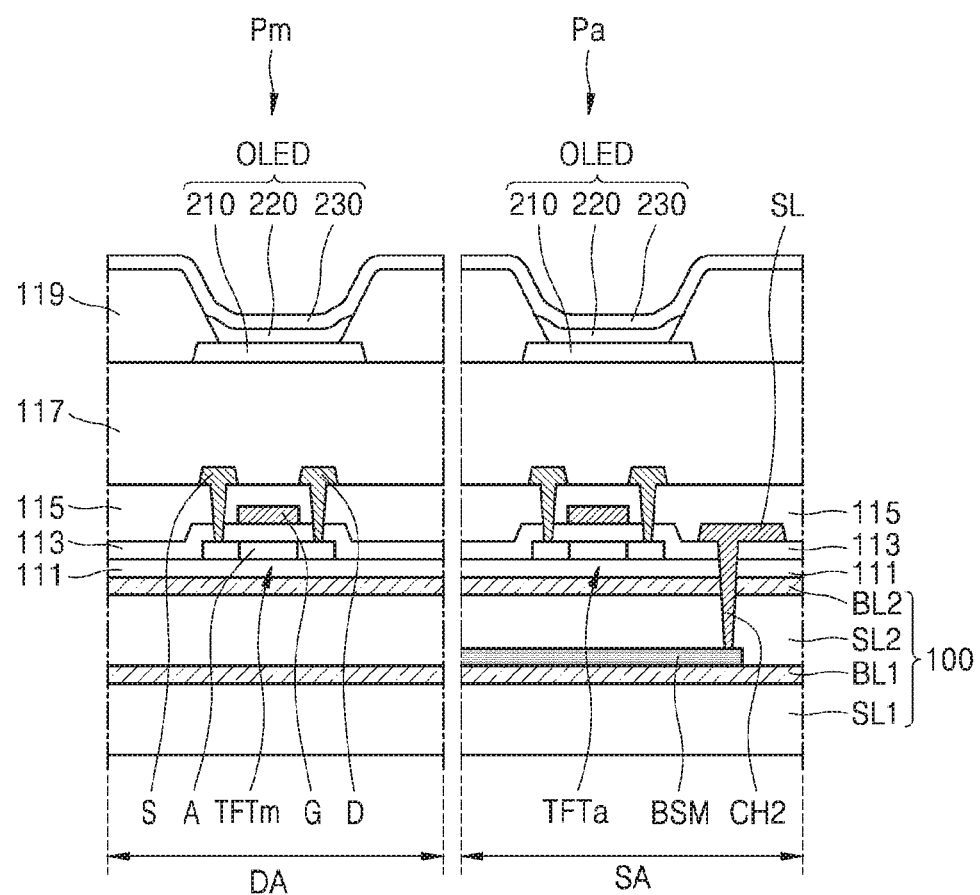
Figure 10:
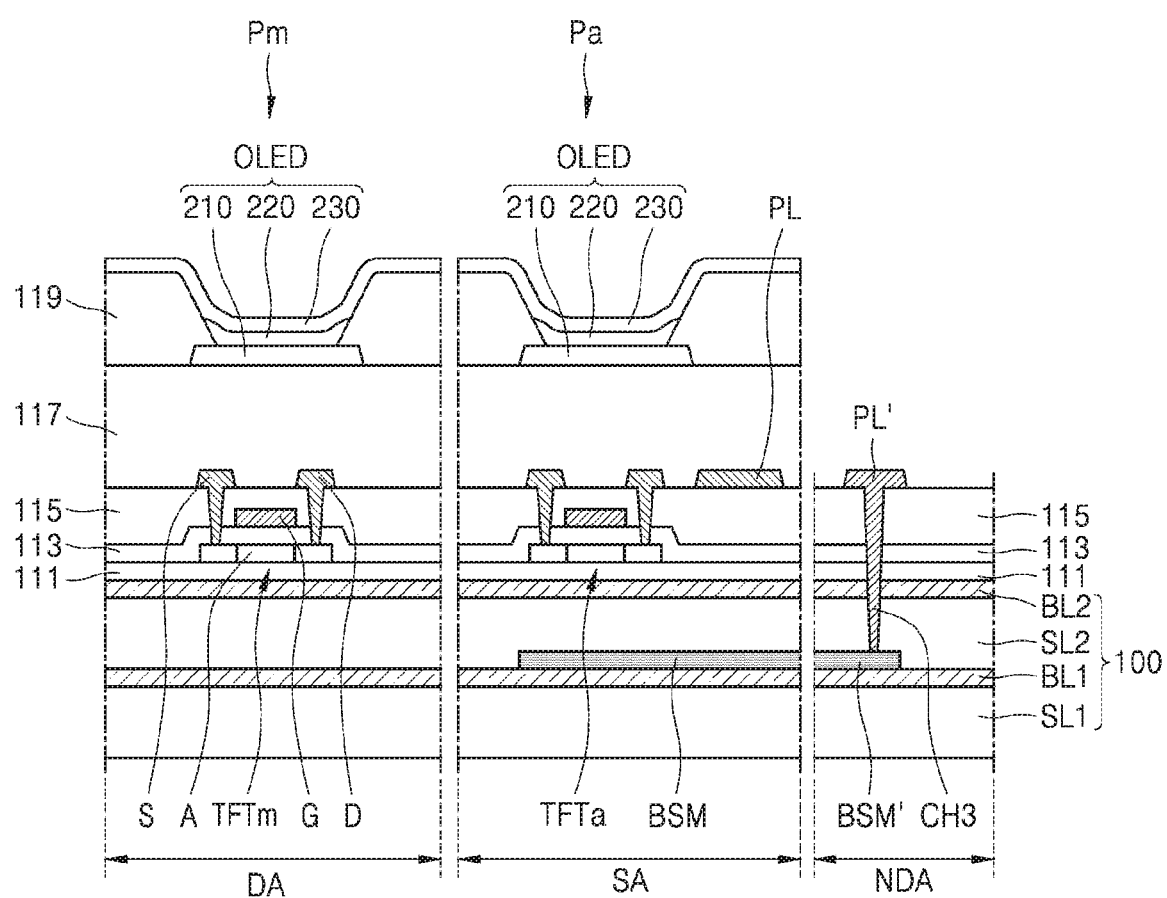
Figure 11:
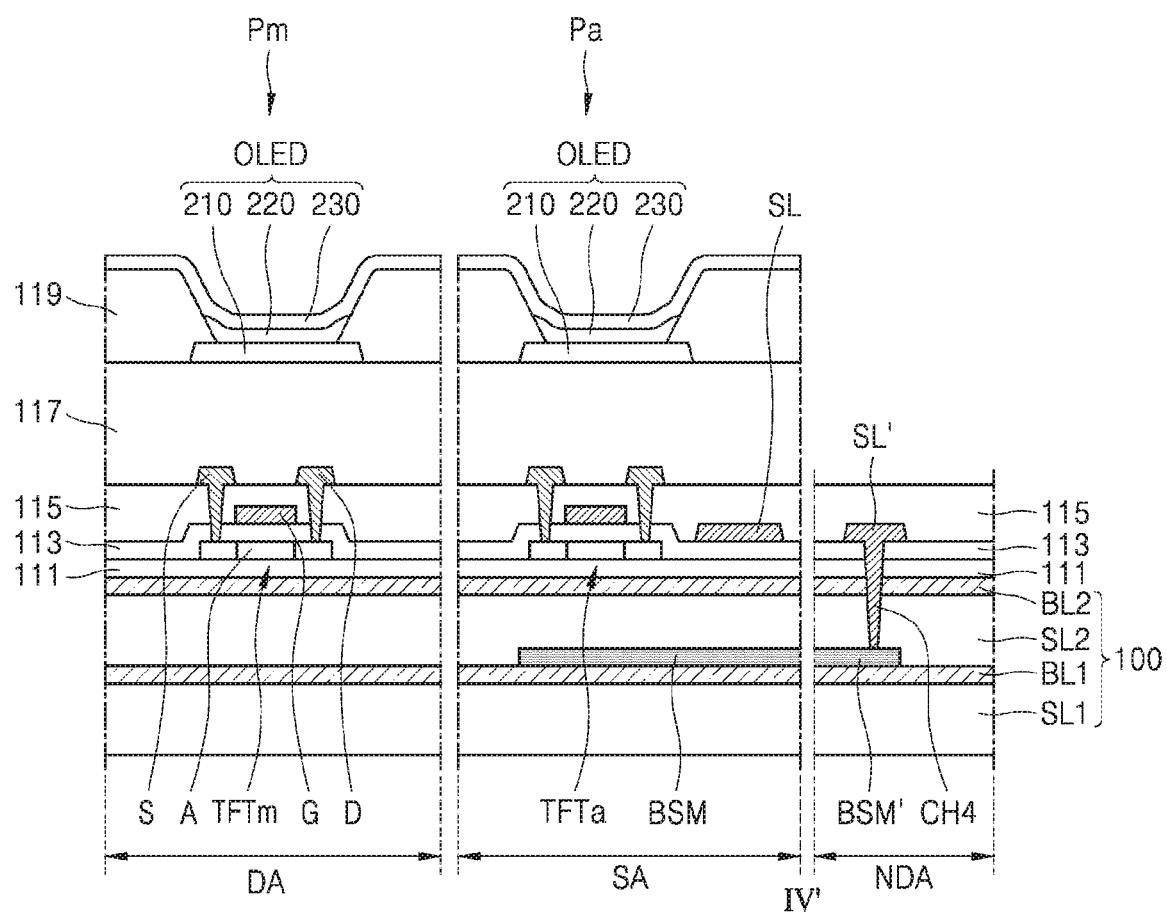

In an embodiment, as shown in FIG. 8, the conductive layer BSM is electrically connected to the driving voltage line PL via a contact hole CH1 within the sensor area SA so that a constant voltage is maintained at the conductive layer BSM. In another embodiment, as shown in FIG. 9, the conductive layer BSM is electrically connected to the scan line SL via a contact hole CH2 within the sensor area SA so that a signal is transmitted to the conductive layer BSM. In another embodiment, as shown in FIG. 10, the conductive layer BSM is electrically connected to a driving voltage connection line PL' that extends in the non-display area NDA, via a contact hole CH3 in the non-display area NDA so that a constant voltage is maintained in the conductive layer BSM. In another embodiment, as shown in FIG. 11, the conductive layer BSM is electrically connected to a scan connection line SL' that extends in the non-display area NDA, via a contact hole CH4 in the non-display area NDA so that a signal is transmitted to the conductive layer BSM. In this way, the conductive layer BSM is in electrical contact with wiring that can transmit power or signals so that a constant voltage or signal is transmitted to the conductive layer BSM. Thus, damage to a pixel circuit due to electrostatic discharges can be prevented.

In the above-described embodiments of FIGS. 8 through 11, according to embodiments, the contact holes CH1, CH2, CH3, and CH4 penetrate the second barrier layer BL2 and the second base layer SL2.

Figure 12:
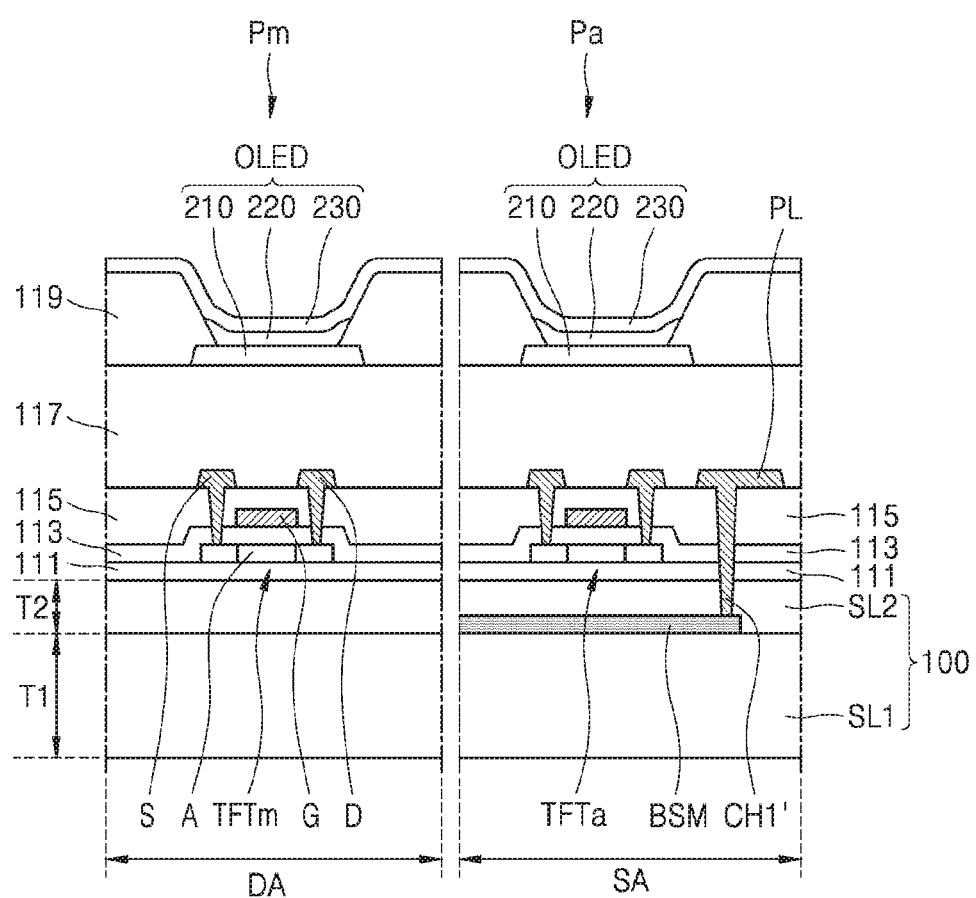
FIGS. 12 and 13 are cross-sectional views of a stack structure included in display panels according to embodiments.
Figure 13:
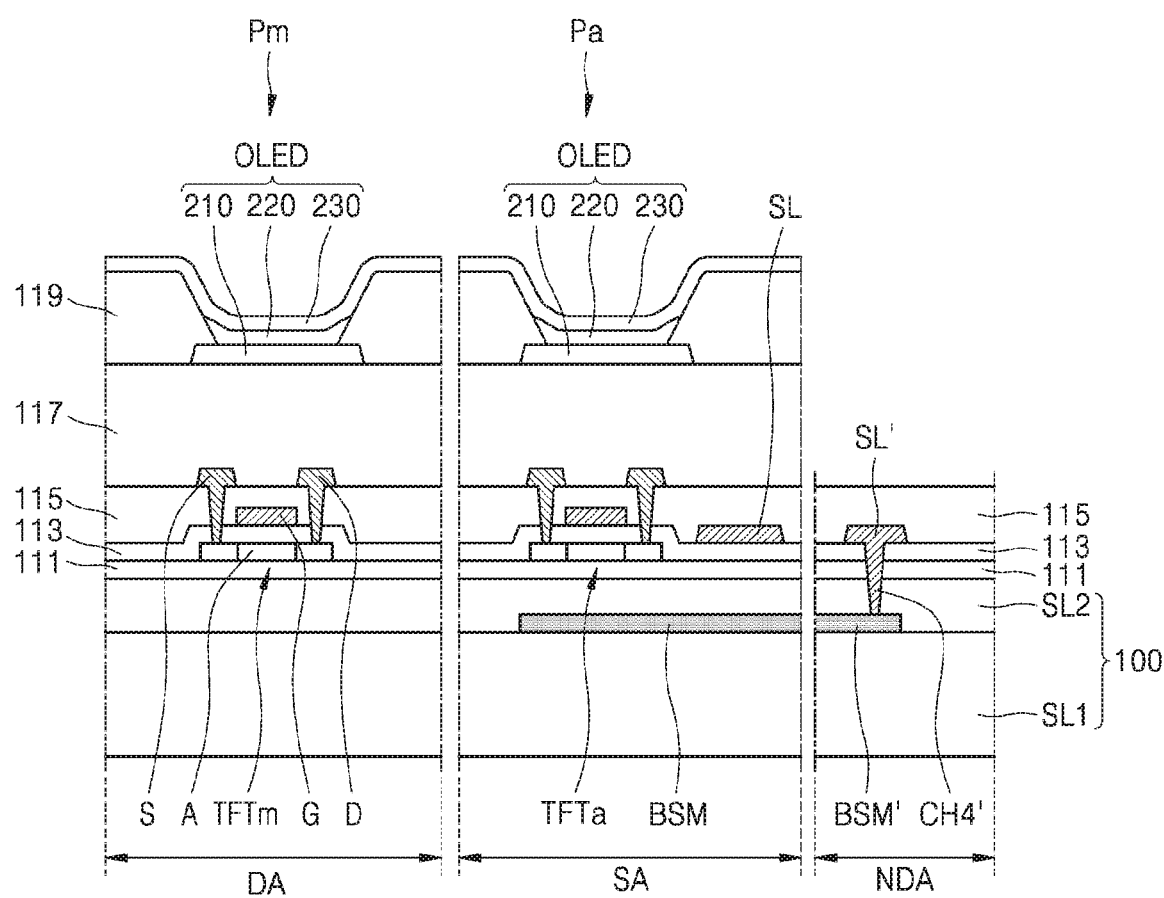

FIGS. 12 and 13 are cross-sectional views schematically illustrating a stack structure included in display panels according to embodiments.

The display panel 10 of FIGS. 12 and 13 is similar to a display panel 10 of FIG. 8 described above but differs from a display panel 10 of FIG. 8 in terms of the structure of the substrate 100. The other configurations of FIGS. 12 and 13 are substantially the same as those of FIG. 8 and thus, the substrate 100 will be described below.

Referring to FIG. 12, according to an embodiment, the substrate 100 includes the first base layer SL1 that includes a glass material and the second base layer SL2 that includes an organic insulating material. In FIG. 12, the first base layer SL1 is a rigid substrate formed of a glass material that serves as a substrate, and the second base layer SL2 is an organic layer that planarizes the top surface of the first base layer SL1. Because the first base layer SL1 substantially supports the display panel 10, a thickness T1 of the first base layer SL1 is greater than a thickness T2 of the second base layer SL2.

In a present embodiment, the conductive layer BSM is positioned at the lower portion of the auxiliary pixel Pa, as in embodiments described above. The conductive layer BSM overlaps a front surface of the lower portion of the auxiliary pixel Pa and overlaps the semiconductor layer Aa of the auxiliary TFT TFTa. The conductive layer BSM prevents light emitted from the component 20 from reaching the auxiliary pixel Pa and the auxiliary TFT TFTa.

In an embodiment, as shown in FIG. 12, the conductive layer BSM is electrically connected to the driving voltage line PL via a contact hole CH1' within the sensor area SA so that a constant voltage is transmitted to the conductive layer BSM. In another embodiment, as in FIG. 13, the conductive layer BSM is electrically connected a scan connection line SL' that extends in the non-display area NDA, via a contact hole CH4' in the non-display area NDA so that a signal is transmitted to the conductive layer BSM. However, as shown in FIG. 9 or 10 described above, the conductive layer BSM can be electrically connected to the scan line SL via a contact hole in the sensor area SA or can be electrically connected to a driving voltage connection line PL' via a contact hole in the non-display area NDA.

In embodiments of FIGS. 12 and 13, the contact holes CH1' and CH4' penetrate the second base layer SL2.

Figure 14:
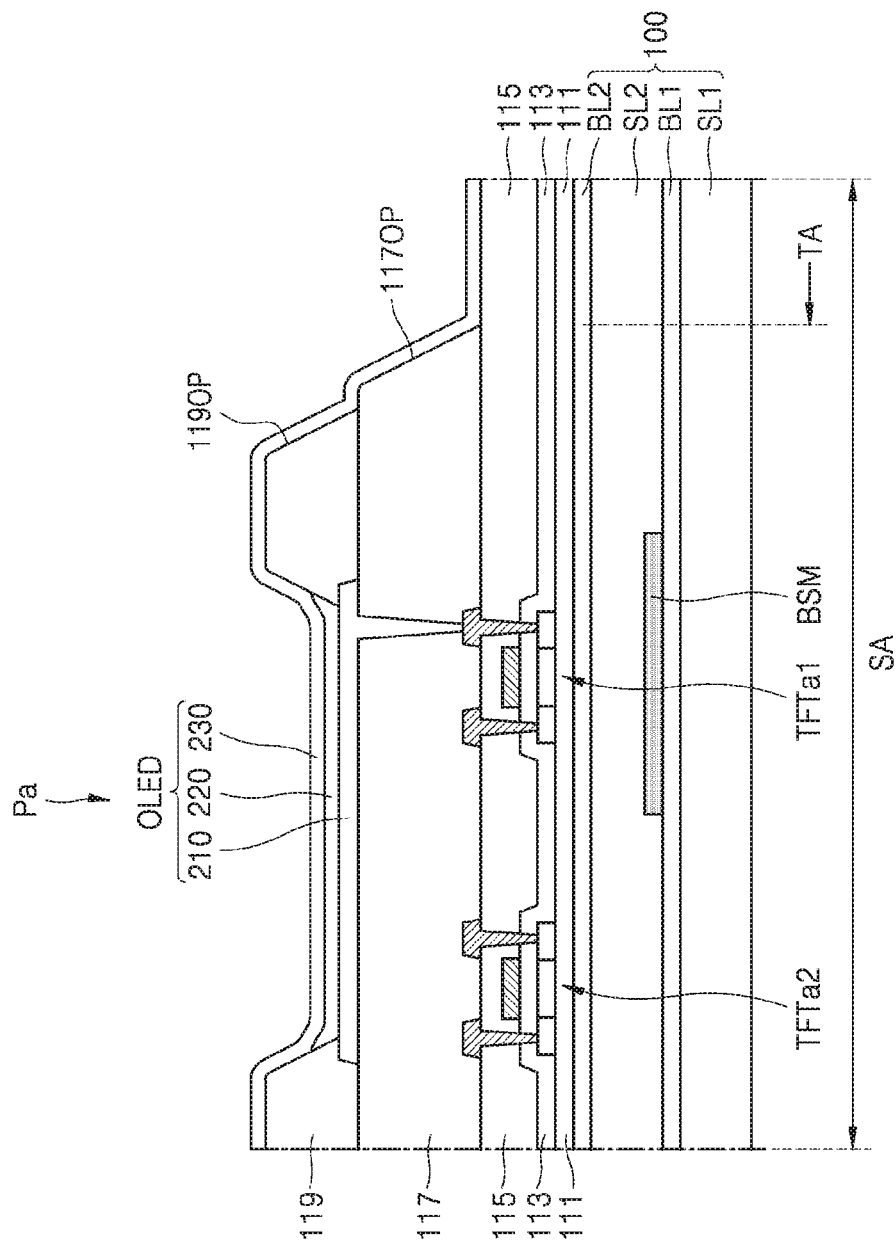
FIGS. 14 through 16 are cross-sectional views of a stack structure included in display panels according to other embodiments.
Figure 15:
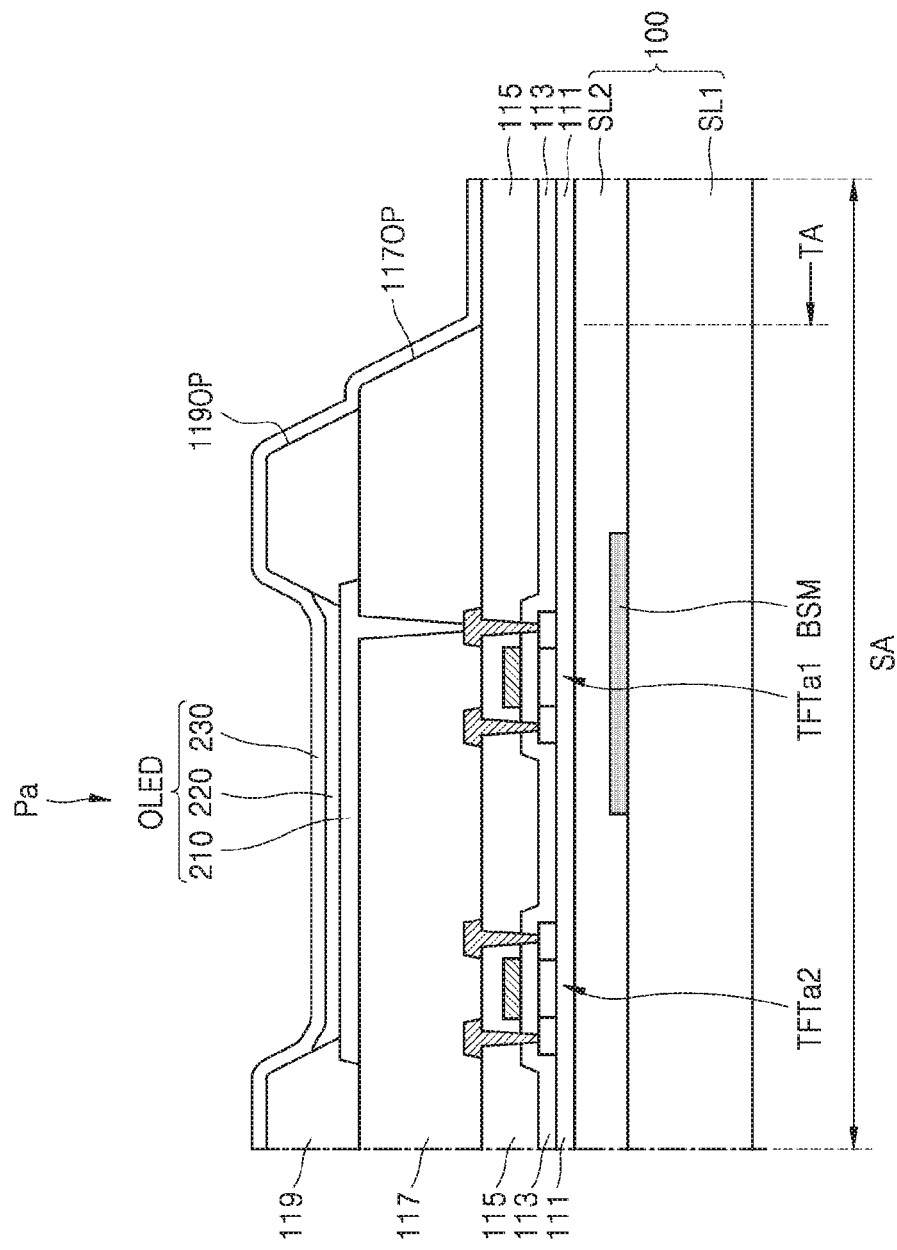
Figure 16:
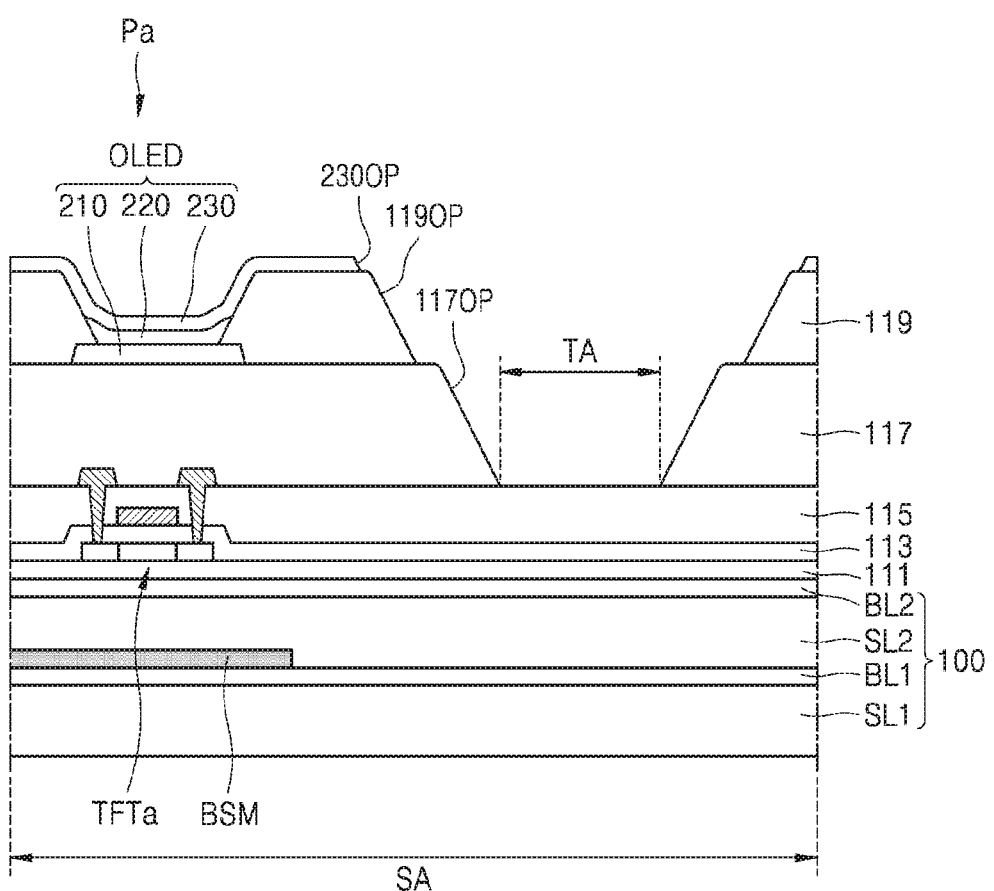

FIGS. 14 through 16 are cross-sectional views of a stack structure included in display panels according to other embodiments.

FIGS. 14 and 15 illustrate a portion of the sensor area SA, and the sensor area SA includes auxiliary pixels Pa and a transmission portion TA.

According to an embodiment, FIG. 14 illustrates a flexible substrate 100 of the display panel 10 that includes the first base layer SL1, the first barrier layer BL1, the second base layer SL2, and the second barrier layer BL2, and FIG. 15 illustrates a rigid substrate 100 of the display panel 10 that includes the first base layer SL1 and the second base layer SL2. In FIG. 15, a top structure of the substrate 100 is the same as that of FIG. 14 and thus, described repeated description will be omitted.

Referring to FIG. 14, according to an embodiment, the auxiliary pixels Pa include two or more auxiliary TFTs TFTa. In a present embodiment, the conductive layer BSM is positioned to correspond to a lower portion of the first auxiliary TFT TFTa1 but does not correspond to a lower portion of the second auxiliary TFT TFTa2.

In an embodiment, when the auxiliary pixel Pa has a pixel circuit of FIG. 6, the first auxiliary TFT TFTa1 may be a driving TFT T1 or a switching TFT T2. In another embodiment, when the auxiliary pixel Pa has a pixel circuit of FIG. 7, the first auxiliary TFT TFTa1 may be at least one of the driving TFT T1, the switching TFT T2, the compensation TFT T3, the first initialization TFT T4, the operation control TFT T5, the emission control TFT T6, or the second initialization TFT T7.

According to an embodiment, the sensor area SA includes a transmission portion TA. The planarization layer 117 includes a first permeable opening 117OP that corresponds to the transmission portion TA, and the pixel-defining layer 119 includes a second permeable opening 119OP.

Thus, according to an embodiment, in the transmission portion TA, a buffer layer 111, a gate insulating layer 113, an interlayer insulating layer 115, and an opposite electrode 230 are stacked on the substrate 100. In the transmission portion TA, an organic layer, such as a HTL, a HIL, an ETL, and an EIL, is further positioned on a front surface of the intermediate layer 220. In addition, the thin-film encapsulation layer 300 or sealing substrate described with reference to FIG. 2 is positioned at an upper portion of the opposite electrode 230.

In another embodiment, as shown in FIG. 16, the opposite electrode 230 is removed in a region that corresponds to the transmission portion TA. In this case, the opposite electrode 230 includes a third permeable opening 230OP that corresponds to the transmission portion TA. In another embodiment, the inorganic insulating layers, i.e., the buffer layer 111, the gate insulating layer 113, and the interlayer insulating layer 115 are removed in a region that corresponds to the transmission portion TA. In this way, some of layers corresponding to the transmission portion TA are removed to improve transmittance in the transmission portion TA.

As described above, according to one or more embodiments, a display apparatus can be implemented that has an enlarged display area in which an image can be displayed even in a sensor area.

Thus, a display apparatus can be provided that has various functions and improved quality.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope as defined by the following claims.

What is claimed is:
1. A display panel, comprising:
a first base layer that includes a display area that includes a plurality of main pixels and a sensor area that includes a plurality of auxiliary pixels and a transmission portion;
a conductive layer positioned on the first base layer and that corresponds to the plurality of auxiliary pixels; and
a second base layer positioned on the first base layer with the conductive layer positioned between the second base layer and the first base layer, wherein a resolution of an image displayed by the sensor area is lower than a resolution of an image displayed by the display area, wherein the second base layer comprises an organic material, wherein the auxiliary pixels comprise
a common electrode that faces a pixel electrode and
an intermediate layer positioned between the pixel electrode and the common electrode, and the common electrode has an opening that corresponds to the transmission portion.

2. The display panel of claim 1, wherein the conductive layer has a thickness of 1500 Å or more.

3. The display panel of claim 1, further comprising:
a first inorganic barrier layer positioned between the first base layer and the second base layer; and
a second inorganic barrier layer positioned on the second base layer,
wherein the second base layer is positioned between the first inorganic barrier layer and the second inorganic barrier layer, and the conductive layer is positioned between the first inorganic barrier layer and the second base layer.

4. The display panel of claim 1, wherein the first base layer comprises organic materials and is flexible.

5. The display panel of claim 1, wherein the sensor area includes
an auxiliary pixel area in which one or more auxiliary pixels are positioned, and
a transmission area in which the transmission portion is positioned, and
the auxiliary pixel area and the transmission area are arranged in a form of a grid.

6. The display panel of claim 5, wherein a position of the conductive layer corresponds to the auxiliary pixel area.

7. The display panel of claim 6, further comprising:
a first wiring electrically connected to the auxiliary pixels and that extends in a first direction; and
a second wiring that extends in a second direction that intersects with the first direction,
wherein the conductive layer is electrically connected to the first wiring or the second wiring via a contact hole.

8. The display panel of claim 7, wherein the contact hole is formed in a non-display area outside the display area.

9. The display panel of claim 1, wherein the auxiliary pixels comprise
a first thin-film transistor that includes a first semiconductor layer and
a second thin-film transistor that includes a second semiconductor layer, and
the conductive layer overlaps the first semiconductor layer and does not overlap the second semiconductor layer.

10. The display panel of claim 1, wherein
the first base layer comprises a glass material.

11. The display panel of claim 10, wherein a thickness of the first base layer is greater than a thickness of the second base layer.

12. A display apparatus, comprising:
a first base layer that includes a display area that includes a plurality of main pixels and a sensor area that includes a plurality of auxiliary pixels and a transmission portion;
a conductive layer positioned on the first base layer and that corresponds to the plurality of auxiliary pixels;
a second base layer positioned on the first base layer with the conductive layer positioned between the second base layer and the first base layer; and
a component positioned under the first base layer and that corresponds to the sensor area,
wherein the second base layer comprises an organic material,
wherein the first base layer and the second base layer comprise organic materials, and
the display apparatus further comprises
a first inorganic barrier layer positioned between the first base layer and the second base layer, and
a second inorganic barrier layer positioned on the second base layer,
wherein the conductive layer is positioned between the first inorganic barrier layer and the second base layer.

13. The display apparatus of claim 12, wherein the component comprises an electronic element that emits or receives light.

14. The display apparatus of claim 12, wherein the conductive layer has a thickness of 1500 Å or more.

15. The display apparatus of claim 12, wherein the sensor area comprises
an auxiliary pixel area in which one or more auxiliary pixels are positioned, and
a transmission area in which the transmission portion is positioned, and
the auxiliary pixel area and the transmission area are arranged in a form of a grid.

16. The display apparatus of claim 12, wherein
the first base layer comprises a glass material, and
the display apparatus further comprises a buffer layer positioned on the second base layer.

17. The display apparatus of claim 12, wherein a resolution of an image displayed by the sensor area is lower than a resolution of an image displayed by the display area.

18. A display panel, comprising:
a first base layer that includes a display area that includes a plurality of main pixels and a sensor area that includes a plurality of auxiliary pixels and a transmission portion;
a conductive layer positioned on the first base layer and that corresponds to the plurality of auxiliary pixels; and
a second base layer positioned on the first base layer with the conductive layer positioned between the second base layer and the first base layer,
wherein the sensor area includes
an auxiliary pixel area in which one or more auxiliary pixels are positioned, and
a transmission area in which the transmission portion is positioned, and
the auxiliary pixel area and the transmission area are arranged in a form of a grid.

* * * * *